(12) United States Patent
Saimen

(10) Patent No.: US 7,190,065 B2
(45) Date of Patent: Mar. 13, 2007

(54) CIRCUIT SUBSTRATE, SEMICONDUCTOR MODULE AND METHOD OF MANUFACTURING CIRCUIT SUBSTRATE

(75) Inventor: Munehide Saimen, Saka (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/853,286

(22) Filed: May 26, 2004

(65) Prior Publication Data
US 2005/0006763 A1    Jan. 13, 2005

(30) Foreign Application Priority Data
Jun. 2, 2003   (JP)   ............... 2003-156848

(51) Int. Cl.
   *H01L 23/48*   (2006.01)
   *H01L 23/52*   (2006.01)
   *H01L 29/40*   (2006.01)

(52) U.S. Cl. ............... 257/694; 257/778; 257/779; 257/780; 257/784

(58) Field of Classification Search ........ 257/734–738, 257/758, 777–795, 666–673, 690–697
See application file for complete search history.

(56) References Cited

U.S. PATENT DOCUMENTS 5,929,521 A * 7/1999 Wark et al. ................. 257/737
2002/0149118 A1* 10/2002 Yamaguchi et al. ........ 257/778
2003/0160325 A1* 8/2003 Yoneda et al. .............. 257/758

FOREIGN PATENT DOCUMENTS

JP          05-063134       3/1993

* cited by examiner

*Primary Examiner*—Cuong Nguyen
(74) *Attorney, Agent, or Firm*—Oliff & Berridge, PLC

(57) ABSTRACT

To enhance bonding accuracy to a lead electrode, while coping with narrowing pitch of the lead electrodes, a lead electrode, whose bonding surface is sharpened, is provided to a film substrate, and a protruding electrode is bonded to the lead electrode, while having a bonding surface of the lead electrode bite into the protruding electrode.

5 Claims, 4 Drawing Sheets

CIRCUIT SUBSTRATE, SEMICONDUCTOR MODULE AND METHOD OF MANUFACTURING CIRCUIT SUBSTRATE

BACKGROUND OF THE INVENTION

1. Field of Invention

The present invention relates to a circuit substrate, a semiconductor module, and a method of manufacturing the circuit substrate, and in particular is suitably applied to a lead electrode used for a flip-chip method and a TAB (Tape Automated Bonding) method or the like.

2. Description of Related Art

In a related art TCP (Tape Carrier Package), COF (Chip On Film), COG (Chip On Glass) or the like, there is a method of bonding a bump electrode, formed on a semiconductor chip, to a lead electrode, for example, as disclosed in Japanese laid-open patent publication No. H5-63134, in order to couple a semiconductor chip and a film substrate.

SUMMARY OF THE INVENTION

However, because the cross-sectional shape of the related art lead electrode is a trapezoid, the top width of the lead electrode becomes wide. For this reason, a high load is applied at the time of bonding the bump electrode. Thus there is a problem that damage occurs in a semiconductor chip or the like. Moreover, as an array pitch of lead electrodes becomes narrow, the height of the lead electrode becomes larger than the top width of the lead electrode. This causes the degradation of flatness of the lead electrode. Thus there are also problems that positional offset occurs and lead breakage occurs at the time of bonding the lead electrode.

The present invention provides a circuit substrate, a semiconductor module, and a method of manufacturing the circuit substrate, which can enhance the bonding accuracy to a lead electrode, while coping with narrowing pitch of the lead electrodes.

In order to address the above-described problems, a circuit substrate according to one exemplary embodiment of the present invention includes an insulating substrate, and a lead electrode, provided to the insulating substrate and whose bonding surface is sharpened. Accordingly, the protruding electrode can be bonded to the lead electrode, while having the bonding surface of the lead electrode bite into the protruding electrode. For this reason, the protruding electrode can be bonded to the lead electrode, while securing the protruding electrode to the lead electrode. Thus, the positional offset of the protruding electrode can be reduced or prevented, and the protruding electrode can be bonded with sufficient accuracy. Moreover, the load can be concentrated on the bonding surface of the lead electrode when bonding the protruding electrode to the lead electrode, and the load at the time of bonding the protruding electrode can be reduced. Thus, the damage to the semiconductor chip can be reduced. Furthermore, by sharpening the bonding surface of the lead electrode, it becomes unnecessary to flatten the top surface of the lead electrode, which eliminates the need to control the flatness of the lead electrode and enables coping with narrowing pitch of the lead electrodes easily.

Moreover, in the circuit substrate according to one exemplary embodiment of the present invention, an average top width of the bonding surface is 7 µm or less. This allows the bonding surface of the lead electrode to bite into the protruding electrode easily. The positional offset of the protruding electrode can be reduced or prevented when bonding the protruding electrode to the lead electrode. Furthermore, the load can be concentrated on the bonding surface of the lead electrode. Thus the load at the time of bonding the protruding electrode can be reduced.

Moreover, a circuit substrate according to one exemplary embodiment of the present invention includes an insulating substrate, a lead electrode, provided to the insulating substrate, and a protruding portion, provided to the bonding surface of the lead electrode. Accordingly, the protruding electrode can be bonded to the lead electrode, while having the protruding portion, which is provided to the bonding surface of the lead electrode, bite into the protruding electrode. For this reason, the protruding electrode can be bonded to the lead electrode, while securing the protruding electrode to the lead electrode. Thus, the positional offset of the protruding electrode can be reduced or prevented, and the protruding electrode can be bonded with sufficient accuracy. Moreover, the load can be concentrated on the protruding portion, provided to the bonding surface of the lead electrode, when bonding the protruding electrode to the lead electrode, and the load at the time of bonding the protruding electrode can be reduced. Thus, the damage to the semiconductor chip can be reduced. Furthermore, by providing the protruding portion on the bonding surface of the lead electrode, it becomes unnecessary to flatten the top surface of the lead electrode, which eliminates the need to control the flatness of the lead electrode and enables coping with narrowing pitch of the lead electrodes easily.

Moreover, a semiconductor module according to one exemplary embodiment of the present invention includes a semiconductor chip, a protruding electrode, provided to the semiconductor chip, a lead electrode, to which the protruding electrode is bonded and whose bonding surface is sharpened, and a base material, where the lead electrode is formed. Accordingly, the protruding electrode can be bonded to the lead electrode, while having the bonding surface of the lead electrode bite into the protruding electrode. The positional offset of the protruding electrode can be reduced or prevented when bonding the protruding electrode to the lead electrode. Furthermore, the load can be concentrated on the bonding surface of the lead electrode, and the load at the time of bonding the protruding electrode can be reduced.

Moreover, a semiconductor module according to one exemplary embodiment of the present invention includes a semiconductor chip, a protruding electrode, provided to the semiconductor chip, a lead electrode, to which the protruding electrode is bonded, a base material, where the lead electrode is formed, and a protruding portion, provided to the bonding surface of the protruding electrode. Accordingly, the protruding electrode can be bonded to the lead electrode, while having the protruding portion, provided to the bonding surface of the lead electrode, bite into the protruding electrode. Thus, the positional offset of the protruding electrode can be reduced or prevented when bonding the protruding electrode to the lead electrode. Furthermore, the load can be concentrated on the protruding portion, provided to the bonding surface of the lead electrode, and the load at the time of bonding the protruding electrode can be reduced.

Moreover, a method of manufacturing a circuit substrate according to one exemplary embodiment of the present invention includes: forming a first resist layer on or above an insulating substrate; forming a first opening portion in the first resist layer by patterning the first resist layer; forming a lead electrode on the insulating substrate by embedding a conductive layer in the first opening portion; removing the first resist layer; forming a second resist layer on or above the insulating substrate, where the lead electrode is formed; forming a second opening portion, whose opening area is smaller than the first opening portion, above the lead electrode by patterning the second resist layer; forming a protruding portion on the lead electrode by embedding a conductive layer in the second opening portion; and removing the second resist layer.

Accordingly, the protruding portion can be provided to the bonding surface of the lead electrode by using plating, while the thickness of the protruding portion can be easily adjusted by adjusting the opening area of the second opening portion. For this reason, a plurality of the lead electrodes having the protruding portions can be collectively formed on the insulating substrate, the bonding accuracy of the protruding electrode and the lead electrode can be enhanced, while suppressing the complication of the manufacturing process and enabling coping with narrowing pitch of the lead electrodes.

Moreover, a method of manufacturing a circuit substrate according to one exemplary embodiment of the present invention includes: forming a conductive layer on or above an insulating substrate; forming a resist layer on the insulating substrate, where the conductive layer is formed; exposing the conductive layer by patterning the resist layer; and exposing the insulating substrate by carrying out an isotropic etching of the conductive layer using the patterned resist layer as a mask.

Accordingly, the etching amount in the thickness direction of the conductive layer can be changed. The etching amount in the horizontal direction can be increased as approaching to the top surface of the conductive layer. For this reason, the lead electrode can be formed, while sharpening the bonding surface of the lead electrode, enabling coping with narrowing pitch of the lead electrode, while suppressing the complication of the manufacturing process, the lead electrode can be bonded while having the bonding surface of the lead electrode bite. The bonding accuracy of the protruding electrode and the lead electrode can be enhanced.

Moreover, a method of manufacturing a circuit substrate according to one exemplary embodiment of the present invention includes: forming a lead electrode, whose bonding surface is sharpened, on an insulating substrate by discharging a conductive material onto the insulating substrate. Accordingly, the shape of the lead electrode can be changed by controlling the discharging position of the conductive material, thus the lead electrode, whose bonding surface is sharpened, can be easily formed.

DETAILED DESCRIPTION OF EXEMPLARY EMBODIMENTS

Figure 1A:
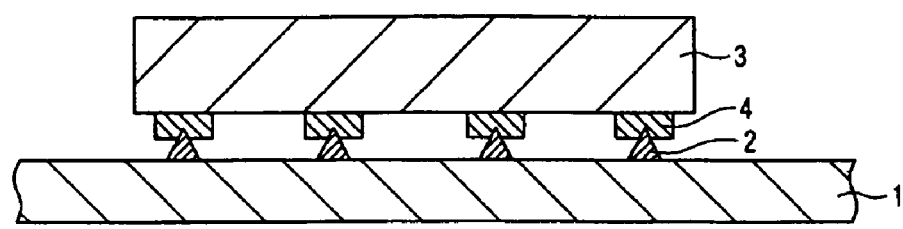
FIGS. 1(A) and 1(B) are schematics of a semiconductor module according to a first exemplary embodiment.
Figure 1B:
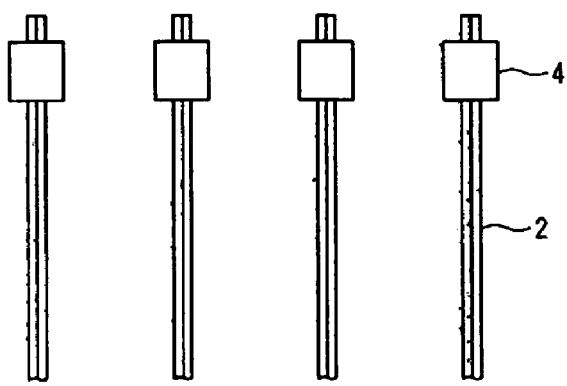

Hereinafter, a semiconductor module and a method of manufacturing a circuit substrate according to exemplary embodiments of the present invention will be described with reference to drawings. FIG. 1(A) is a cross-sectional schematic showing a structure of a semiconductor module according to a first exemplary embodiment of the present invention. FIG. 1(B) is a schematic showing a structure of protruding electrodes and lead electrodes of FIG. 1(A).

In FIG. 1, a lead electrode 2, whose bonding surface is sharpened, is formed on a film substrate 1. A protruding electrode 4 is formed on a semiconductor chip 3. Then, the semiconductor chip 3 is mounted above the film substrate 1 by bonding the protruding electrode 4 onto the lead electrode 2. The width of the bottom surface of the protruding electrode 4 can be set to approximately 15 μm. The width of the lead electrode 2 can be set to approximately 10 μm, for example. Moreover, the average top width of the bonding surface of the lead electrode 2 is preferably set to 7 μm or less.

Accordingly, the protruding electrode 4 can be bonded to the lead electrode 2, while having the bonding surface of the lead electrode 2 bite into the protruding electrode 4. For this reason, the protruding electrode 4 can be bonded to the lead electrode 2, while securing the protruding electrode 4 to the lead electrode 2. Thus, the positional offset of the protruding electrode 4 can be reduced or prevented, and the protruding electrodes 4 can be bonded with sufficient accuracy. Moreover, the load can be concentrated on the bonding surface of the lead electrode 2 when bonding the protruding electrode 4 to the lead electrode 2, and the load at the time of bonding of the protruding electrode 4 can be reduced. Thus, the damage to the semiconductor chip 3 can be reduced. Furthermore, by sharpening the bonding surface of the lead electrode 2, it becomes unnecessary to flatten the top surface of the lead electrode 2, which eliminates the need to control the flatness of the lead electrode 2 and enables coping with narrowing pitch of the lead electrodes 2 easily.

In the exemplary embodiment of FIG. 1, a method of forming the lead electrode 2 on the film substrate 1 is described. However, in addition to the film substrate 1, for example, a printed circuit board, a multilayer-interconnection substrate, a build-up substrate, a tape substrate, a glass substrate or the like may be employed. Moreover, as for the material of the substrate, where the lead electrode 2 is formed, for example, polyimide resin, glass epoxy resin, BT resin, a composite of aramid and epoxy, or ceramics or the like can be used. Moreover, as for the protruding electrode 4, for example, Au bump, Au/Ni bump, Cu bump and Ni bump coated with solder material, or a solder ball or the like can be used. Moreover, as for the lead electrode 2, for example, copper (Cu), iron (Fe), gold (Au), silver (Ag), copper (Cu) coated with solder material, copper (Cu) coated with gold (Au) or the like can be used.

Moreover, when bonding the protruding electrode 4 to the lead electrode 2, for example, metal bonding, such as solder bonding, alloy bonding may be used, and pressure-welding bonding, such as ACF (Anisotropic Conductive Film) bonding, NCF (Nonconductive Film) bonding, ACP (Anisotropic Conductive Paste) bonding, NCP (Nonconductive Paste) bonding may be used. Moreover, in the above-described exemplary embodiment, a method of arranging the lead electrode 2 and the protruding electrodes 4 in a straight array is described. However, the lead electrode 2 and the protruding electrodes 4 may be arranged, for example, in a staggered array or in a radial arrangement. Moreover, the bonding surface of the lead electrode 2 may be rounded.

Moreover, in the above-described exemplary embodiment, the COF (Chip On Film) is described as an example. However, the exemplary embodiment may be applied to all semiconductor packages, in which a face-down mounting, such as TCP (Tape Carrier Package), COG (Chip On Glass), TCM (Tape Carrier Module), is carried out. Moreover, in the above-described exemplary embodiment, the case where the width of the protruding electrode 4 is larger than the width of the bottom surface of the lead terminal 2 is described as an example. However, the width of the protruding electrode 4 may be the same as the width of the bottom surface of the lead terminal 2, or the width of the protruding electrode 4 may be smaller than the width of the bottom surface of the lead terminal 2.

FIG. 2 is a cross-sectional schematic showing a method of manufacturing a circuit substrate according to a second exemplary embodiment of the present invention. In FIG. 2(A), a seed electrode 12 is formed on a film substrate 11 by electroless plating, sputtering, or vapor deposition, for example. As for the seed electrode 12, conductive materials, such as nickel (Ni), chromium (Cr), titanium (Ti), and tungsten (W), copper (Cu) can be used. Next, a resist layer 13 is formed above the film substrate 11, where the seed electrode 12 is formed. An opening portion 13a, which exposes the seed electrode 12, is formed in the resist layer 13 by exposing and developing the resist layer 13a.

Figure 2A:
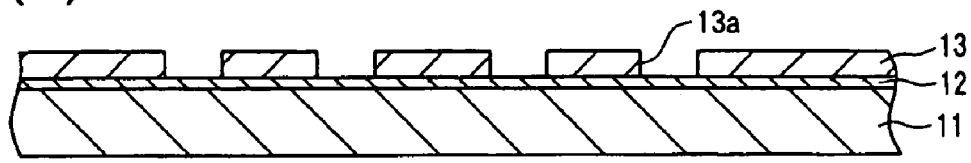
FIGS. 2(A)–2(E) are cross-sectional schematics showing a method of manufacturing a circuit substrate according to a second exemplary embodiment.
Figure 2B:
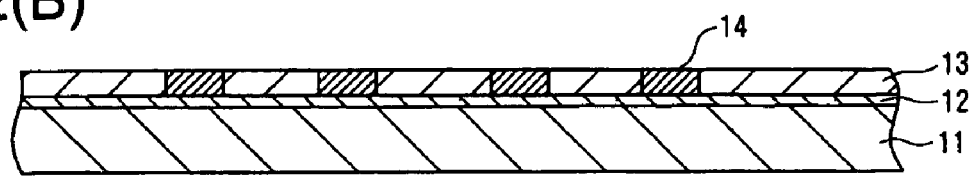
Figure 2C:
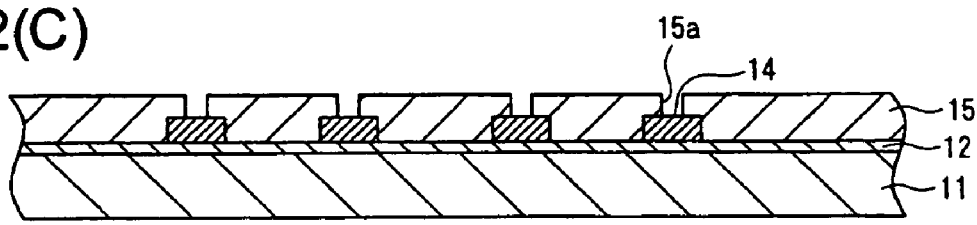

Next, as shown in FIG. 2(B), a lead electrode 14, coupled to the seed electrode 12, is formed in the opening portion 13a by carrying out electrolytic plating using the seed electrode 12 as a plating lead. As for the lead electrode 14, nickel (Ni), gold (Au), copper (Cu), solder material or the like can be used. Next, as shown in FIG. 2(C), the resist layer 13 is removed. Then, a resist layer 15 is formed above the film substrate 11, where the lead electrode 14 are formed. An opening portion 15a, arranged above the lead electrode 14, is formed in the resist layer 15 by exposing and developing the resist layer 15. The opening area of the opening portion 15a can be made smaller than the opening area of the opening portion 13a.

Figure 2D:
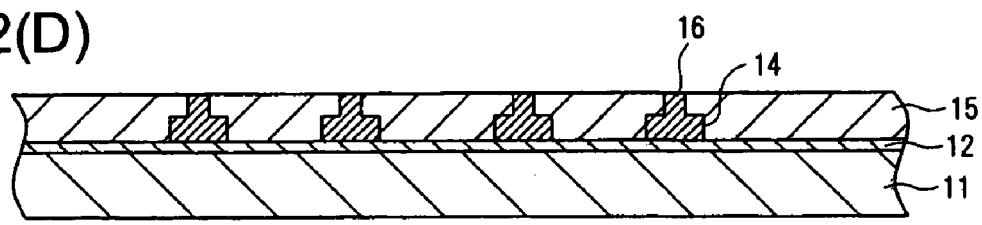
Figure 2E:
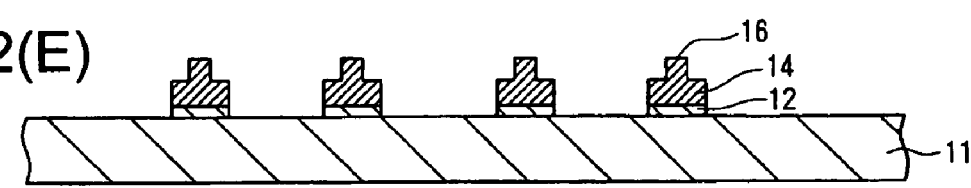

Next, as shown in FIG. 2(D), a protruding portion 16, arranged above the lead electrode 14, is formed in the opening portion 15a by carrying out electrolytic plating using the seed electrode 12 as a plating lead. As for the protruding portion 16, nickel (Ni), gold (Au), copper (Cu), solder material or the like can be used, for example. Next, as shown in FIG. 2(E), the resist layer 15 is removed. Then, the film substrate 11 is exposed by etching the seed electrode 12 using the lead electrode 14 as a mask.

Accordingly, the protruding portion 16 can be provided to the leading end of the lead electrode 14 using electrolytic plating, while the thickness of the protruding portion 16 can be easily adjusted by adjusting the opening area of the opening portion 15a formed in the resist layer 15. For this reason, a plurality of the lead electrodes 14 having the protruding portions 16 can be collectively formed above the film substrate 11. The bonding accuracy of the lead electrode 14 can be enhanced, while suppressing the complication of the manufacturing process and enabling coping with narrowing pitch of the lead electrodes 14.

In the exemplary embodiment of FIG. 2, a method of forming the lead electrode 14 having the protruding portion 16 by electrolytic plating is described. However, the lead electrode 14 having the protruding portion 16 may be formed by electroless plating. Moreover, the protruding portion 16 may be rounded. FIG. 3 is a cross-sectional schematic showing a method of manufacturing a circuit substrate according to a third exemplary embodiment of the present invention.

Figure 3A:
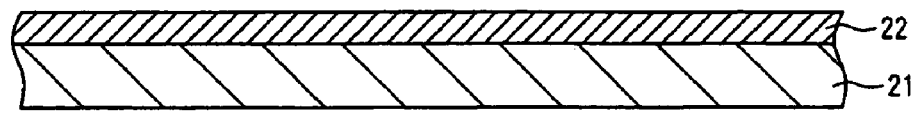
FIGS. 3(A)–3(D) are cross-sectional schematics showing a method of manufacturing a circuit substrate according to a third exemplary embodiment.
Figure 3B:
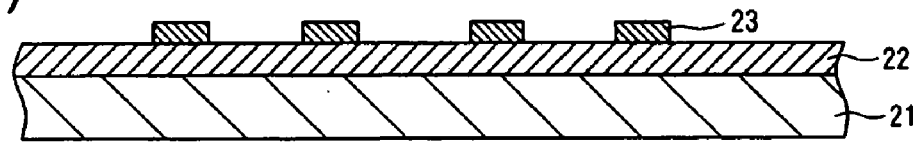

In FIG. 3(A), a conductive layer 22 is formed on a film substrate 21 by attaching a metal foil, made of copper (Cu) or the like, onto the film substrate 21. Next, as shown in FIG. 3(B), resist is applied onto the conductive layer 22. Then, by exposing and developing the resist, which is applied on the conductive layer 22, a plurality of resist layers 23, arranged with a predetermined interval, are formed on the conductive layer 22.

Figure 3C:
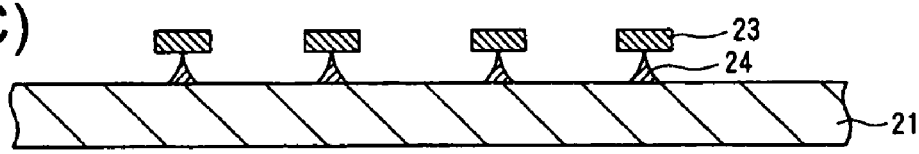
Figure 3D:
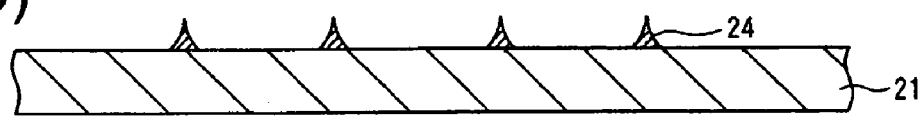

Next, as shown in FIG. 3(C), by carrying out an isotropic etching of the conductive layer 22 using the resist layer 23 as a mask, the surface of the film substrate 21 is exposed. A lead electrode 24, whose bonding surface end is sharpened, is formed on the film substrate 21. A wet etching, a plasma etching or the like, can be used as an isotropic etching of the conductive layer 22. Then, as shown in FIG. 3(D), the resist layer 23 on the lead electrode 24 is removed.

By exposing the surface of the film substrate 21 using an isotropic etching of the conductive layer 22, the etching amount in the thickness direction of the conductive layer 22 can be changed. The etching amount in the horizontal direction can be increased as approaching to the top surface of the conductive layer 22. For this reason, the lead electrode 24 can be formed, while sharpening the bonding surface of the lead electrode 24, enabling coping with narrowing pitch of the lead electrodes 24, while suppressing the complication of the manufacturing process, the lead electrode 24 can be bonded while having the bonding surface of the lead electrode 24 bite, and the bonding accuracy to the lead electrode 24 can be enhanced.

In the exemplary embodiment of FIG. 3, a method of forming the conductive layer 22 on the film substrate 21 by attaching a metal foil onto the film substrate 21 is described. However, the conductive layer 22 may be formed on the film substrate 21 using a method of plating or the like. FIG. 4 is a cross-sectional schematic showing a manufacturing method of a circuit substrate according to a fourth exemplary embodiment of the present invention.

Figure 4A:
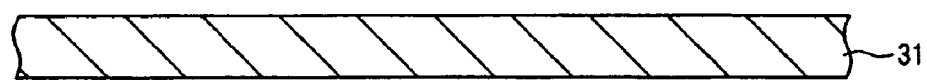
FIGS. 4(A) and 4(B) are cross-sectional schematics showing a method of manufacturing a circuit substrate according to a fourth exemplary embodiment.
Figure 4B:
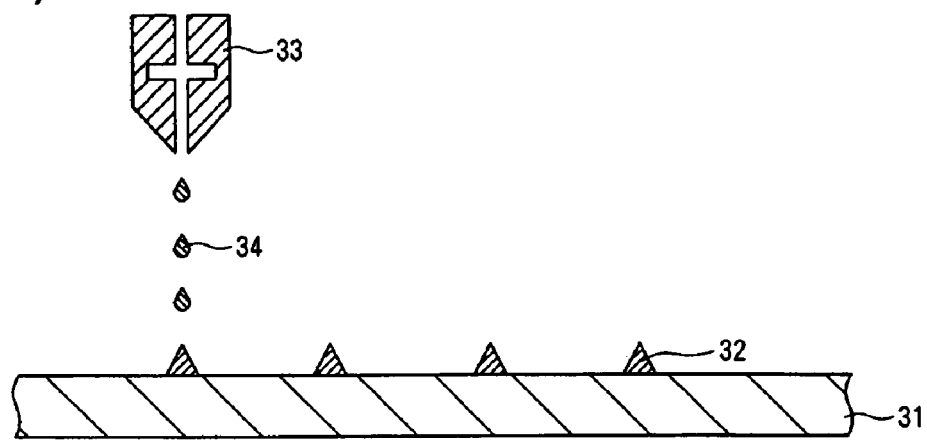

In FIG. 4(A), an ink jet head 33 is placed above a film substrate 31. Then, as shown in FIG. 4(B), while controlling the position of the ink jet head 33, a lead electrode 32, whose bonding surface is sharpened, is formed on the film substrate 31 by discharging a droplet 34, composed of conductive material, onto the film substrate 31 through the ink jet head 33. As for the droplet 34, for example, metal slurry or metal paste, in which metal powders, such as nickel (Ni), gold (Au) or copper (Cu) is dispersed in a solvent, can be used.

Accordingly, the shape of the lead electrode 32 can be changed by controlling the discharging position of the droplet 34. Thus the lead electrode 32, whose bonding surface is sharpened, can be easily formed on the film substrate 31.

What is claimed is:

1. A circuit substrate, comprising:
    an insulating substrate;
    a lead electrode formed on the insulating substrate, the lead electrode having a top surface, a bonding portion and a pulled out wiring portion;
    a semiconductor chip mounted above the insulating substrate; and
    a protruding electrode formed on the semiconductor chip and bonded to the bonding portion of the lead electrode such that the pulled out wiring portion of the lead electrode extends from the protruding electrode, the top surface of the lead electrode being continuously sharpened from the bonding portion to the pulled out wiring portion of the lead electrode.

2. The circuit substrate according to claim 1 the lead electrode having a top width and a bottom width, the top width of the lead electrode being, on average, 7 µm or less.

3. The circuit substrate according to claim 2, the lead electrode being integrally formed from the bottom width to the top width of the lead electrode.

4. The circuit substrate according to claim 2, the bottom width of the lead electrode being wider than the top width of the lead electrode.

5. A semiconductor module, comprising:
a semiconductor chip;
a protruding electrode formed at the semiconductor chip;
a lead electrode having a top surface, a bonding portion and a pulled out wiring portion; and
a protruding electrode bonded to the bonding portion of the lead electrode such that the pulled out wiring portion of the lead electrode extends from the protruding electrode, the top surface of the lead electrode being continuously sharpened from the bonding portion to the pulled out wiring portion of the lead electrode.

* * * * *